US00RE38900E

(19) United States
(12) Reissued Patent
Rostoker et al.

(10) Patent Number: US RE38,900 E
(45) Date of Reissued Patent: Nov. 29, 2005

(54) AUTOMATING PHOTOLITHOGRAPHY IN THE FABRICATION OF INTEGRATED CIRCUITS

(75) Inventors: Michael D. Rostoker, Boulder Creek, CA (US); Nicholas F. Pasch, Pacifica, CA (US); Ashok K. Kapoor, Palo Alto, CA (US)

(73) Assignee: LSI Logic Corporation, Milpitas, CA (US)

(21) Appl. No.: 09/273,171

(22) Filed: Mar. 19, 1999

Related U.S. Patent Documents

Reissue of:
(64) Patent No.: 5,663,076
Issued: Sep. 2, 1997
Appl. No.: 08/512,678
Filed: Aug. 8, 1995

(51) Int. Cl.[7] ..... H01L 21/66
(52) U.S. Cl. ..... 438/14; 438/16; 700/121; 716/21
(58) Field of Search ..... 438/10, 11, 14, 438/16, 17, 18, 129, 598, 599; 700/121; 716/21

(56) References Cited

U.S. PATENT DOCUMENTS 4,948,458 A * 8/1990 Ogle ..... 156/643
5,129,009 A 7/1992 Lebeau
5,329,334 A * 7/1994 Yim et al. ..... 355/53
5,414,636 A * 5/1995 Ema ..... 437/52
5,426,375 A * 6/1995 Roy et al. ..... 437/8
5,468,681 A 11/1995 Pasch
5,477,545 A 12/1995 Huang
5,485,243 A 1/1996 Rostoker et al.
5,495,419 A 2/1996 Rostoker et al.
5,498,579 A * 3/1996 Borodovsky et al. ..... 437/51
5,526,517 A 6/1996 Jones et al.
5,566,078 A 10/1996 Ding et al.
5,663,076 A 9/1997 Rostoker et al.
5,691,949 A 11/1997 Hively et al.
5,821,624 A 10/1998 Pasch

OTHER PUBLICATIONS

J. B. Carter et al., "Transformer Coupled Plasma Etch Technology for the Fabrication of Sub–half Micron Structures," 1992.*
U.S. Appl. No. 09/064,802, filed Apr. 22, 1998, Michael D. Rostoker et al., Automating Photolithography in the Fabrication of Printed Circuits.

* cited by examiner

*Primary Examiner*—Chandra Chaudhari
(74) *Attorney, Agent, or Firm*—Carr & Ferrell LLP

(57) ABSTRACT

Automated photolithography of integrated circuit wafers is enabled with a processor connected to a Rayleigh derator, a form factor generator, a logic synthesizer, a layout generator, a lithography module and a wafer process. The Rayleigh derator receives manufacturing information resulting from yield data in the wafer process, and this manufacturing data is then used to derate the theoretical minimum feature size available for etching wafer masks given a known light source and object lens numerical aperture. This minimum feature size is then used by a form factor generator in sizing transistors in a net list to their smallest manufacturable size. A logic synthesizer then converts the net list into a physical design using a layout generator combined with user defined constraints. This physical design is then used by the mask lithography module to generate wafer masks for use in the semiconductor manufacturing. Manufacturing data including process and yield parameters is then transferred back to the Rayleigh processor for use in the designing of subsequent circuits. In this way, a direct coupling exists between the measurement of wafer process parameters and the automated sizing of semiconductor devices, enabling the production of circuits having the smallest manufacturable device sizes available for the given lithography and wafer process.

42 Claims, 7 Drawing Sheets

123

| Device | Type | Nodes | IDS | VGS | Size |
|---|---|---|---|---|---|
| M1 | NMOS | S1 D1 G1 SB1 | IDS1 | VGS1 | W1 L1 |
| M2 | NMOS | S2 D2 G2 SB2 | IDS2 | VGS2 | W2 L2 |
| M3 | PMOS | S3 D3 G3 SB3 | IDS3 | VGS3 | W3 L3 |
| ..... | ..... | ..... | ..... | ..... | ..... |
| Mn | | Sn Dn Gn SBn | IDSn | VGSn | Wn Ln |

FIG. 3

AUTOMATING PHOTOLITHOGRAPHY IN THE FABRICATION OF INTEGRATED CIRCUITS

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates generally to systems for integrated circuit manufacture. More particularly, the present invention relates to a system and method for automating the photolithography procedure utilized in fabricating integrated circuits and for automating the manufacture of integrated circuits having an optimal feature size.

2. Description of the Related Art

The manufacture of integrated circuits is a complex process which combines the technologies of photolithography, physics and chemistry. In one common method of semiconductor manufacture, wafers of pure silicon are coated with thin layers of photo-resist. Each coated wafer is then exposed to a light source which is projected through an etched mask layer imaged adjacent to the wafer. The etched mask layer only passes light to selected regions of the wafers, resulting in the exposing of the resist at those selected regions. The exposed regions of the photo-resist are removed, opening small windows of silicon on the surface of the wafer. These windows enable doping impurities to be diffused or deposited onto the exposed wafer regions. Following exposure of the windowed regions of the wafer to the doping impurities, the resist is completely removed from the wafer and the process is repeated using additional layers of mask levels. Additional photo-resist layers may be subsequently used to selectively mask the wafer surface for further processing such as etching, formation of interconnect lines, and the like. Using this lithographic-diffusion technique, very complex systems of electronically active devices can be accurately produced. From start to finish it is not unusual for six to twenty mask levels to be used in the wafer manufacturing process.

Important advantages are achieved with semiconductor devices by making the individual electronic device features as small as possible. The smaller the individual devices are, the more devices that can be put on a single IC wafer. Higher densities, therefore, translate into lower materials cost for individual components. A further significant benefit of this reduced materials cost results from the fact that discrete defects on the silicon substrate randomly exist across the wafer. When the individual circuit dice consume smaller areas of substrate, the probability of silicon defects per unit die is decreased, thus resulting in higher yields and lower per unit cost. In addition to savings in manufacturing costs achievable with reduced device sizes, device speeds are increased and power is reduced per unit device as the devices become smaller.

Thus, what is needed, and one problem which is addressed by the present invention, is to design circuits having the smallest possible device feature sizes for an available manufacturing process.

A second problem that is being faced in the electronics industry, is the need for increasingly faster design and production cycles for semiconductor devices. The economies of integration, which can be achieved by utilizing customized semiconductor devices in electronic systems, makes it highly desirable to design application specific circuits where possible. One limitation to using customized circuits in electronic products is that the amount of time required to design and produce these integrated circuits makes them impractical for many commercial applications. Often, producers of electronic goods will design a product using conventional discrete or off-the-shelf components, and then over time begin to integrate and customize the circuitry as revisions to the product are produced. There may be a time in the not-too-distant future when a system will enable the circuit designer to enter a schematic of a required electronic device, and have a tabletop unit sitting next to the computer begin immediately generating finished integrated circuit products, much in the same way a printer reproduces a paper document. Today, however, the complexities of the device physics and chemistry require the use of complex lithography systems and highly controlled chemical process ovens.

What is further needed, therefore, is a system and method for automating photolithography procedures used in the fabrication of integrated circuits.

SUMMARY OF THE INVENTION

In accordance with the present invention, a system enables the automated photolithography of semiconductor integrated circuits. The system is controlled as a processor which is coupled to a Rayleigh derator, a form factor generator, a logic synthesizer, a lithography module and a wafer process. A Rayleigh processor receives light source and numerical aperture information from the lithography module, and also receives manufacturing process data from the wafer process. The light source information, the numerical aperture data and the manufacturing information are combined together to derate the theoretical minimum resolvable feature size which may be manufactured using a wafer process. This derating consists of a combined consideration of both theoretical limitations produced by the lithography equipment, as well as measured results from manufacturing variations occurring in the wafer process. The Rayleigh processor communicates this minimum resolvable feature size to the form factor processor, which then uses standard sizing models to determine the minimum device size for each transistor in a circuit design net list. The form factor processor receives $I_{DS}$ (drain source current), $V_{GS}$ (gate to source voltage), and gate length information from the circuit net list and calculates a corresponding minimum manufacturable gate width which can be used to satisfy the design requirements. Once all transistors in the net list have been sized, a logic processor produces a physical design for production of a photolithographic wafer mask set. Following production of the wafer mask set, wafers are then manufactured in the wafer process. Manufacturing and yield data from the processed wafers is then collected and used to subsequently update the Rayleigh processor. In this way, the present invention is achieved: a direct coupling between the measurement of wafer process parameters and the automated sizing of semiconductor devices. Such invention enables the production of circuits having the smallest manufacturable device sizes available for the given photolithography equipment and wafer process.

Although the preferred embodiment relies on a single computer to control the automated system of the present invention, an alternative embodiment utilizes multiple computers or processing facilities to control various aspects of the system. For instance, in one alternative embodiment, Rayleigh derating is controlled using a first computer with the minimum feature size being stored. The minimum feature size is then conventionally communicated to a second computer which controls form factor generation and layout generation. A third computer controls the etching of wafer masks. A fourth computer monitors the wafer process and collects test results data for communication back to the Rayleigh derating performed by the first computer.

BRIEF DESCRIPTION OF THE FIGURES

FIG. 3 shows the preferred memory structure of the net list database embodied in the photolithography system of FIG. 1;

DETAILED DESCRIPTION OF THE PREFERRED EMBODIMENTS

Figure 1:
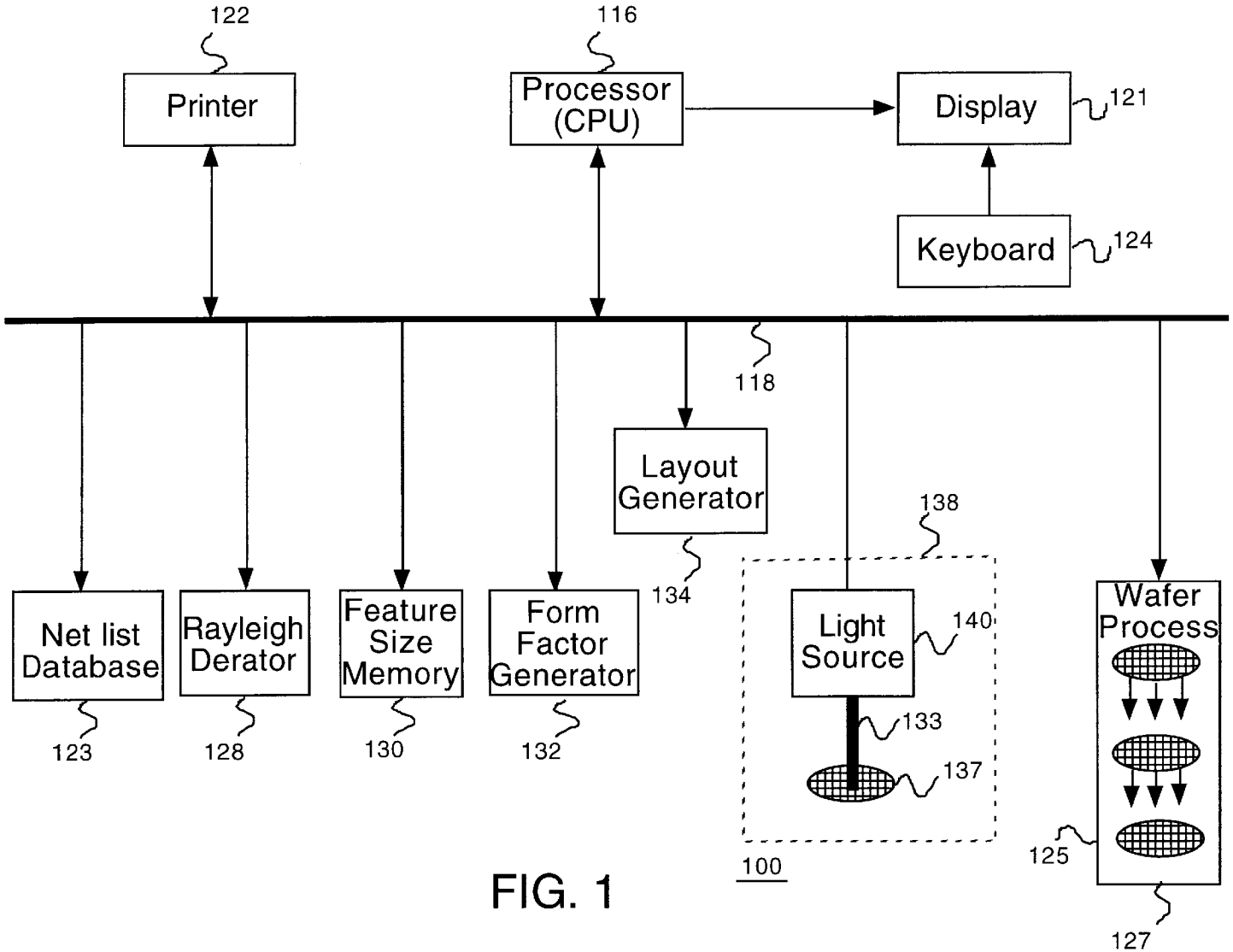
FIG. 1 is a block diagram illustrating the preferred system of the present invention for automating photolithography in the fabrication of integrated circuits.

Referring now to FIG. 1, a block diagram illustrates an overview of an Integrated Circuit (IC) design system 100 constructed in accordance with the present invention, and capable of implementing the preferred method of the present invention. The IC system 100 includes a display 121, a central processor unit (CPU) 116, and a plurality of memories coupled in a von Neuman architecture via databus 118, such as is conventionally found in general purpose microprocessor-based computers. The preferred embodiment of system 100 is implemented on a Sun Workstation, manufactured by Sun Microsystems of Mountain View, Calif. Processor 116 is also coupled to an input device such as a keyboard 124, and optionally to an output device such as a printer 122. Processor 116 is further coupled through databus 118 to net list database 123, Rayleigh derator 128, feature size memory 130, form factor generator 132, logic synthesizer 134, lithography module 138, and wafer process 125 used in the manufacture of wafers 127. Although the CPU 116 is preferably implemented using a single computer, the CPU could alternatively be implemented as a networked or distributed computing system with multiple processors connected to the various peripheral components. Indeed, the system 100 could equivalently be implemented using separate multiple CPU's 116, with data transferred between the CPU's using conventional file transfer techniques. For instance, in one alternative embodiment, the Rayleigh derator 128 is controlled using a first computer. A second computer controls the form factor generator 132 and layout generator 136, while a third computer controls the lithography module 138. A fourth computer monitors the wafer process 125 and collects test results data for communication back to the Rayleigh derator 128.

The function of the IC design system 100 is to enable an integrated circuit designer to size and process integrated circuits as an automated function, beginning with the circuit net list and producing processed wafers as an end product. For purposes of the discussion below and the appended claims, the term "manufacture" is defined to generally comprise this process of designing and producing integrated circuit wafers. One of the several advantages of the present invention is the ability to automatically measure process parameters of the wafer process 125 and to use these process parameters to automatically calculate the minimum feature size which may be designed using the lithography module 138. Use of the automated system 100 is particularly well suited for devices having feature sizes (i.e. transistor gate widths) of less than approximately 0.3 microns, since the impact of even small process variations becomes significant at these reduced geometries. This minimum feature size, attainable in the lithography module 138, is then used to size transistors stored in a net list database 123, and then to synthesize and layout the logic necessary to produce the designed circuitry.

Rayleigh derator 128 is used to determine the minimum IC device feature size that can be practically manufactured using a specific lithographic light source 140 in combination with the various process tolerances of wafer process 125. The Rayleigh derator 128 begins operation by determining the theoretical minimum feature size available for a device, based on the light wavelength of light source 140 used in etching the wafer masks 137. The minimum theoretical device size that can be produced by a specific light source 140 is a direct function of the wavelength of the light source 140. The physics for this theoretical determination is well understood and is discussed in the text, Radiation and Optics: An Introduction to the Classical Theory, John M. Stone, McGraw-Hill Book Company, Inc. pp. 144, 180–182. The Rayleigh derator 128 then derates this minimum theoretical limit using image separability considerations produced as a function of the numerical aperture of the objective lens used in the lithography module 138. Once the theoretical minimum distance of line resolution is determined, this resolution is further derated by a manufacturing constant, m, which is empirically derived based on process tolerances extracted from the wafer process 125. Manufacturing factors which effect the derating of the minimum line resolution include conventional variations in mechanical steps used in the wafer process 125, accuracy of temperature controls, and chemical purities of the wafer process 125 materials. To a lesser extent the manufacturing constant, m, is also impacted by the mechanical and electrical stability and alignment of the lithography equipment used in lithography module 138. Other factors which are taken into account in generating the manufacturing constant m, include such effects as the Critical Resist Modulation Transfer Function (CMTF), proximity effects of the photolithographic process, and the modulation transfer function (MTF) of the lithography module 138. These issues are discussed in the text Silicon Processing For The VLSI Era, by Stanley Wolf and Richard Tauber, Lattice Press, pp. 412–413 and 464–467, which is incorporated herein by reference.

Figure 2:
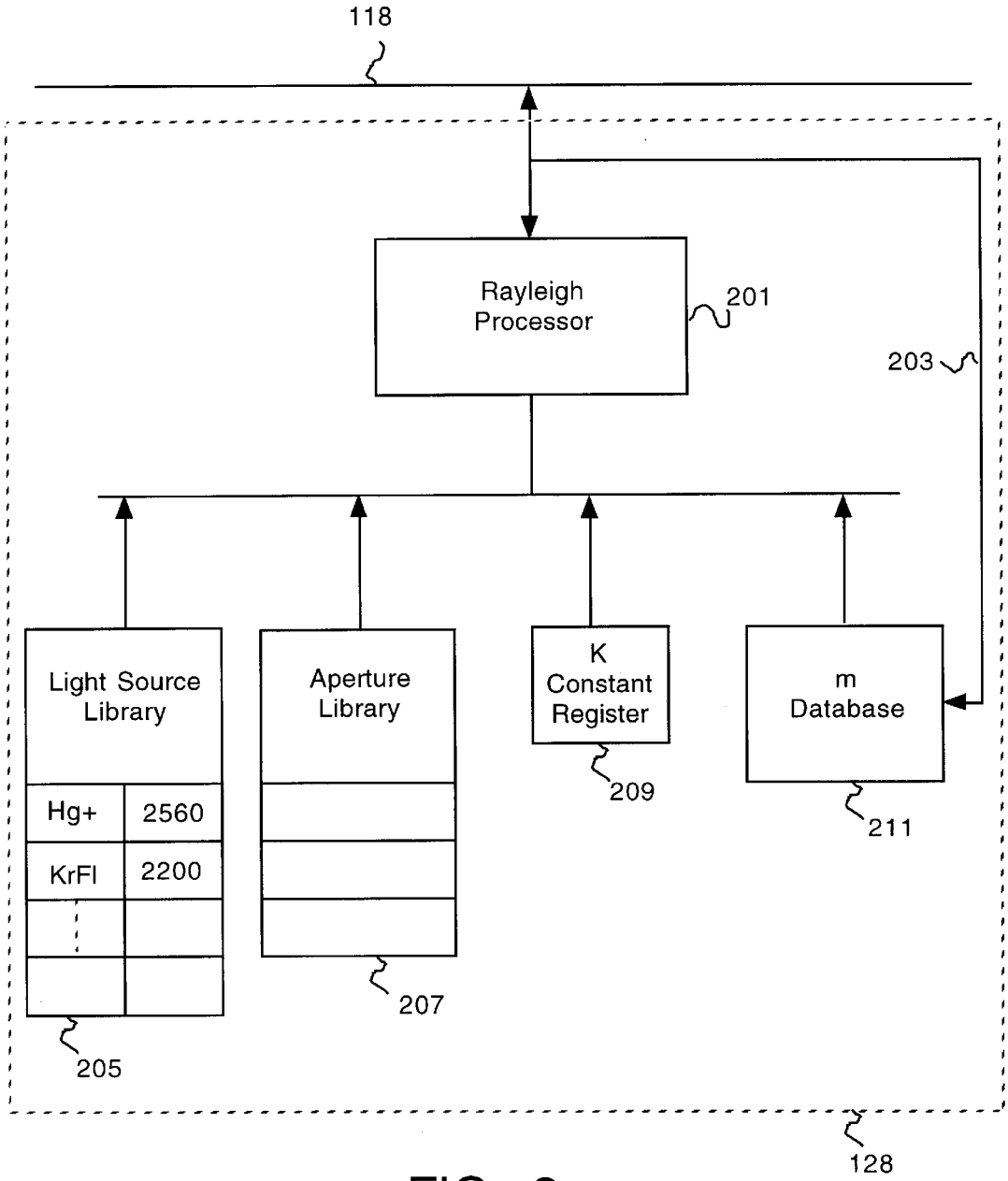
FIG. 2 is a block diagram showing the architectural overview of the Rayleigh derator embodied in the photolithography system of FIG. 1.

Referring now to FIG. 2, a block diagram is shown, illustrating details of the Rayleigh derator 128. Processor 116 connects to the Rayleigh derator 128 via databus 118. Determination of the minimum, manufacturable, IC device feature size in the Rayleigh derator 128 is controlled by Rayleigh processor 201. Rayleigh processor 201 is preferably a software procedure executed by processor 116. Rayleigh processor 201 has access to several memory registers, libraries and processes, including light source library 205, aperture library 207, constant register 209, and m database 211. Manufacturing constant m database 211 contains compiled information relating to the variables of the semiconductor manufacturing process, as discussed above. These process variables are collected, assigned weighting factors and processed to produce a single manufacturing constant m. In the preferred embodiment, the data which is used to generate the manufacturing constant m is automatically collected by the processor 116 from the wafer process 125 during the manufacture of IC's. This data relating to variations in the wafer process 125 is continuously collected and stored in the m database 211 via data bus 203, for use by the Rayleigh processor 201 in the derating process. The exact weights assigned to values of the collected data are initially arbitrarily set and experimentally adjusted to improve wafer yield, based on wafer-test measurements taken on finished wafer products. These wafer-test measurements on finished wafer products are also preferably and automatically collected by processor 116 and transferred to the m database 211. It should be noted that the wafer-test measurements can be performed on both test wafers 127, prior to production, as well as on in-line wafers 127 as production progresses. Preferably, testing is performed on conventional test devices and structures designed into the manufactured wafer. The collection of process measurements and the weighting of these process measurements based on wafer-test results form a feedback process control loop. This process control loop advantageously enables the manufacture of the smallest possible device geometries for existing wafer process 125 line conditions. Since yield information is readily available for use in the m constant calculation, trade-off analysis can be easily performed by the system 100 in order to balance the benefits of small device geometries against the benefits of higher yields. This trade-off analysis enables the adjustment of the m constant to derate the available device feature size to favor either smaller, faster IC devices with lower manufacturing yields, or larger minimum device sizes with higher yields. Typical values for m range between 0.5 and 0.7.

The light source library 205 contains a listing of information relating to the wavelengths of various light sources 140 used in the lithography module 138. Typical wavelength values of preferred light sources 140 include enhanced mercury (Hg+) arc sources which have a wavelength of 2560 Angstroms, and krypton fluoride (KrF) lasers which have a wavelength of approximately 2200 Angstroms.

The numerical aperture library 207 contains a listing of the various values for numerical apertures used in the lithography module 138. This numerical aperture is a value assigned to the lithography module 138 objective lens used in focusing the laser beam 133 onto the wafer mask 137 during the mask etching process. This numerical aperture is a function of the specific lithography equipment used in mask production, and varies between light sources 140 and lithography modules 138. Typical values for numerical apertures range from 0.3 to 0.7. In the preferred embodiment, a numerical aperture of 0.5 is typical.

Also attached to the Rayleigh processor 201 is the k Constant register 209. The k constant register 209 contains a derating value which is theoretically determined and represents minimum separability. This number is often referred to as the Rayleigh constant, k, as described in Radiation and Optics: An Introduction to the Classical Theory, supra.

The Rayleigh processor 201 combines the data stored in the m database 211 with the appropriate wavelength value stored in the light source library 205, the numerical aperture value stored in the aperture library 207, and the Rayleigh constant k stored in the constant register 209, to produce a number which represents the minimum resolvable distance (minimum feature size) which can be achieved using the lithography module 138 in combination with the wafer process 125. This minimum resolvable distance is processed according to the equation:

$$R = \frac{km\lambda}{NA}$$

where λ is equal to the wavelength of the light source 140, NA is equal to the numerical aperture, k is equal to the Rayleigh constant, and m is equal to the manufacturing process constant. This minimum resolvable distance represents the minimum feature size that can be reproduced accurately in a semiconductor circuit using the lithography module 138 in combination with the wafer process 125. In MOS circuit manufacturing, this minimum feature size defines the minimum gate length that can be realized for transistor devices. Since speed, power dissipation and manufacturing costs are all a function of this minimum feature size, optimal design requires that, where possible, transistors having the smallest possible gate lengths be used. This minimum feature size for the gate length of an MOS transistor therefore defines a form factor which is used in the design of MOS semiconductors. Using an enhanced mercury (Hg+) arc light source 140 having a light wavelength of 2560 Angstroms, in combination with a reasonably stable wafer process 125, 0.35 micron transistor lengths are achievable. Use of the krypton fluoride laser light source 140 (shown in light source library 205) having a light wavelength of approximately 2200 Angstroms, with highly controlled manufacturing processes, enables the production of 0.25 micron gate length devices.

Following calculation of the minimum feature size in the Rayleigh derator 128, processor 116 (FIG. 1) stores the minimum feature size in minimum feature size memory 130. As further discussed below, this minimum feature size is used by form factor generator 132 in assigning specific transistor sizes to circuit designs.

Referring now to FIG. 3, a diagram is shown illustrating the preferred memory structure of the net list database 123 of FIG. 1. Net list database 123 contains a list of the circuit components and their interconnections constituting a circuit design to be implemented. The net list database 123 is illustrated in FIG. 3 comprising an exemplary list of MOS transistor devices M1–Mn, along with corresponding columns for storing the device type, node connections, drain to source current ($I_{DS}$), gate-to-source voltage ($V_{GS}$), and device size. This same net list will also conventionally contain information relating to other active and passive devices in the circuit design. Device M1 represents an N-channel MOS device having node connections S1 at the source, a drain connection at node D1, a gate connection at node G1, and a substrate connection at SB1. Correspondingly, device M2 is also an N-channel device having node connections, S2, D2, G2, and SB2. Device M3 is shown as a P-channel device having node connections at S3, D3, G3 and SB3. Device Mn has node connections at Sn, Dn, Gn and SBn. The construction and use of the net list shown in net list database 123 is conventional; and the exact representation of data within the net list database 123 may vary in formatting, depending on the specific requirements of the layout and design applications which reference this data. Also corresponding to each of the transistor devices referenced in the net list database 123, is a size field indicating the size (widths and lengths) of each of the devices in the net list database 123. For instance, device M1 has a gate width of W1 and a gate length of L1. Similarly, device M2 has a gate width of W2 and a gate length of L2, and so on.

When the net list is stored in system 100, connectivity information defining each node connection for the devices M1 through Mn is known and stored. However, no device size information is generally available with the net list until processing by the form factor generator 132 occurs. Following determination of the derated minimum feature size and storage of the minimum feature size in feature size memory 130, the form factor generator 132 is used to determine the appropriate transistor size for each of the devices shown in FIG. 3.

Figure 4:
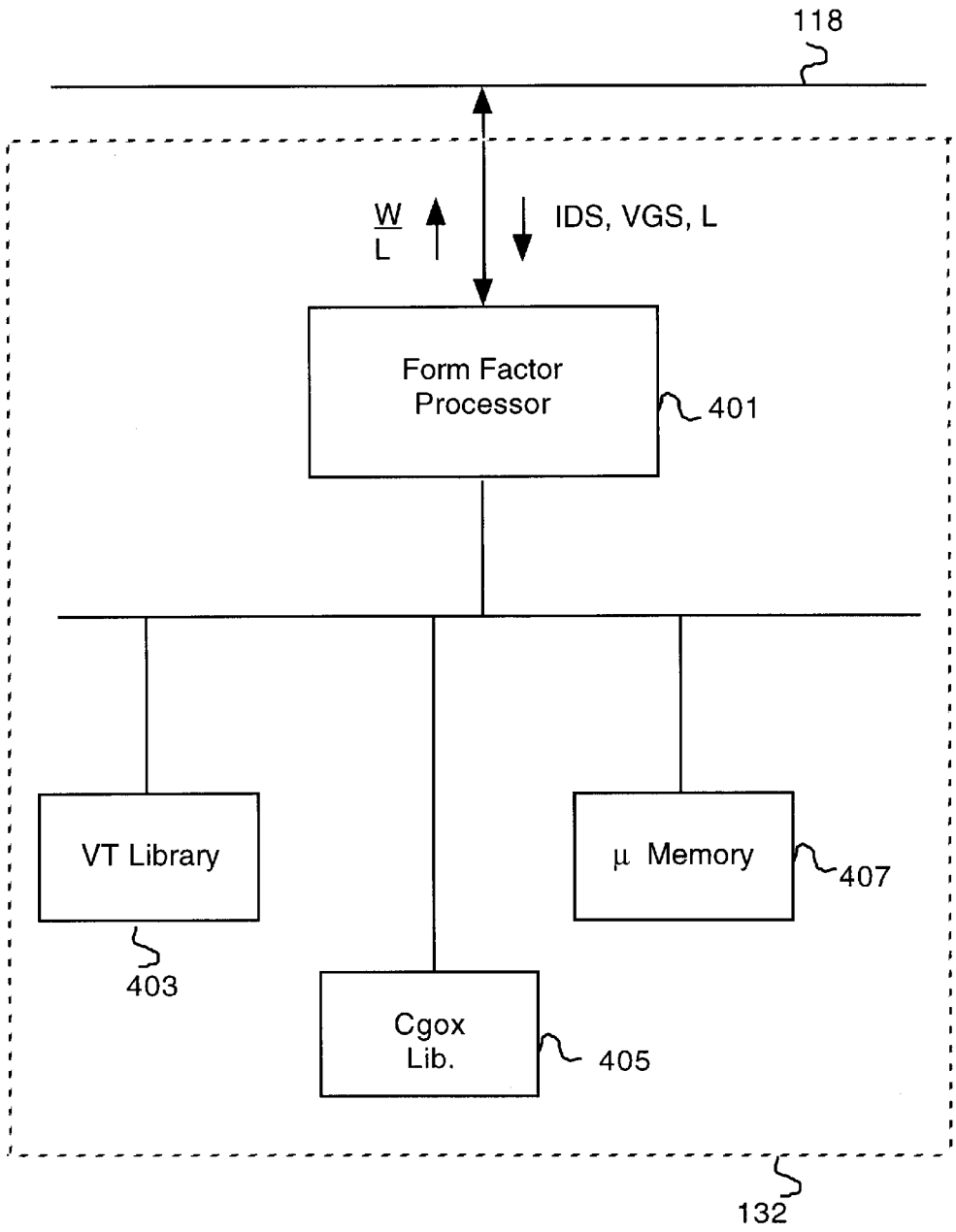
FIG. 4 is a block diagram showing the architectural overview of the form factor generator embodied in the photolithography system of FIG. 1.

Referring now to FIG. 4, form factor generator 132 is shown in detail. Form factor processor 401 is implemented as a software routine running on processor 116. Following storage of the minimum manufacturable feature size in feature size memory 130, processor 116 then proceeds to generate a specific physical design for the electrical circuit design stored in the net list database 123. Form factor processor 401 is used to assign specific transistor sizes to the electrical circuit design.

For each transistor of the electrical circuit design, form factor processor 401 receives a value for the drain-source current, $I_{DS}$, and gate-to-source voltage, $V_{GS}$, from the net list database 123. The form factor processor 401 also reads the minimum feature size from the feature size memory 130, and use this minimum feature size as the default gate length value L. Alternatively, if a non-minimum size L is desired to be used in the electrical circuit design, a preferred value for gate length can be transferred from the net list database 123 to the form factor processor 401 along with the $I_{DS}$ and $V_{GS}$ values for that transistor. Form factor processor 401 calculates transistor gate widths using the conventional sizing formula:

$$I_{DS} = \mu C_{gox} \frac{W}{L} \frac{(V_{GS} - V_T)^2}{2}$$

where $I_{DS}$ is defined as the drain-source current, $C_{gox}$ represents the gate oxide capacitance, W represents the gate width, L represents the gate length, $V_{GS}$ represents the gate-to-source voltage and $V_T$ represents the gate threshold voltage. The value for gate threshold voltage $V_T$ is read from the $V_T$ library 403. $C_{gox}$ library 405 contains the value used by the form factor processor 401 for gate oxide capacitance. Form factor processor 401 receives the values for $I_{DS}$, $V_{GS}$, and L; the processor 401 then reads values of $V_T$, $C_{gox}$, and then calculates an aspect ratio (W/L) for each of the transistors identified in the net list database 123. Each value of W which is determined by form factor processor 401 is then stored in the appropriate W column in net list database 123.

Figure 5:
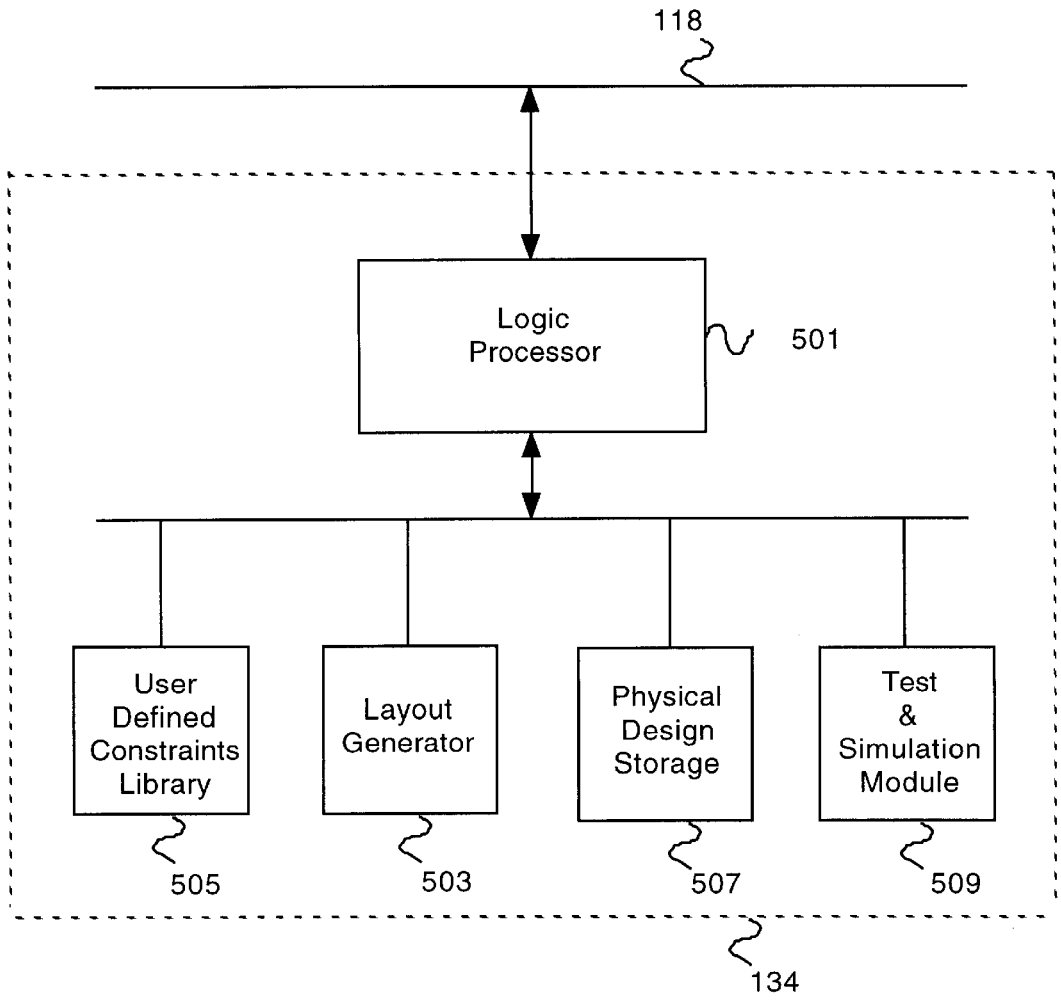
FIG. 5 is a block diagram showing the architectural overview of the logic synthesizer embodied in the photolithography system of FIG. 1.

Referring now to FIG. 5, an overview block diagram is shown representing the architecture of logic synthesizer 134. Logic synthesizer 134 is connected to processor 116 through databus 118. The logic synthesizer 134 contains a logic processor 501, a layout generator 503, a user-defined constraints library 505, a physical design storage 507, and a test and simulation module 509. Logic processor 501 is preferably a software routine which runs on processor 116 to convert the net list stored in net list database 123 into a physically realizable circuit layout which can then be manufactured using wafer process 125. In the preferred embodiment, logic processor 501 is the Engineering Computer-Aided Design (ECAD) tool C-MDE 3.0™, manufactured by LSI Logic Corporation of Milpitas, Calif. Logic processor 501 receives the net list from net list database 123 and applies user defined parameters from the user defined constraints library 505 to place and route a physical design implementation of the circuit design. The placement and routing of circuit designs in the manufacture of integrated circuits is well known. User defined parameters which are stored in constraints library 505 are largely dependent on the exact type and nature of the circuit being manufactured and the place and route tool used to implement the physical design. Exemplary parameters stored in constraints library 505 include the geometrical attributes of the layout (height, width, total area), location of specific inputs and outputs such as power and ground buses, critical path information identifying connections which require the shortest path delays, etc. Implementation of the place and route function is handled by software processes contained in the layout generator 503. A preferred embodiment of this place and route function is the tool C-MDE 3.0, manufactured by LSI Logic Corporation. Once this physical layout is completed, the layout is stored in physical design storage 507. In the preferred embodiment, logic processor 501 performs a test and simulation on the physical design using test and simulation module 509. In the preferred embodiment, test and . simulation module 509 is implemented using the program C-MDE 3.0. Errors which are detected during the test and simulation of the physical design layout are then processed by logic processor 501 and used to make corrections to the physical design. The process of physical design, test and simulation, and adjusting the physical design, is repeated until a working physical design of the electrical circuit is completed.

Figure 6A:
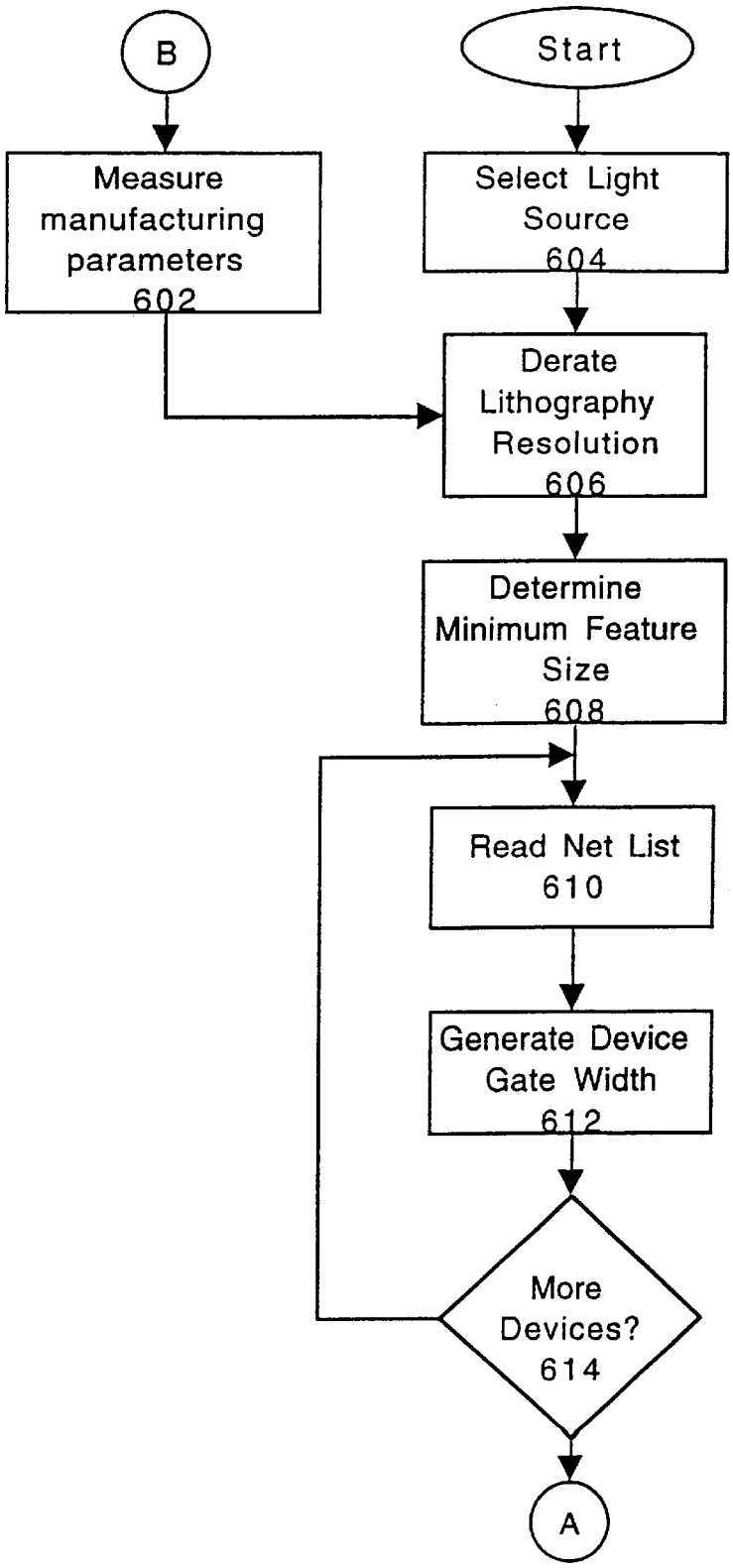
FIGS. 6(a) and 6(b) comprise a flow chart of the preferred method of the present invention for automating photolithography in the fabrication of integrated circuits.
Figure 6B:
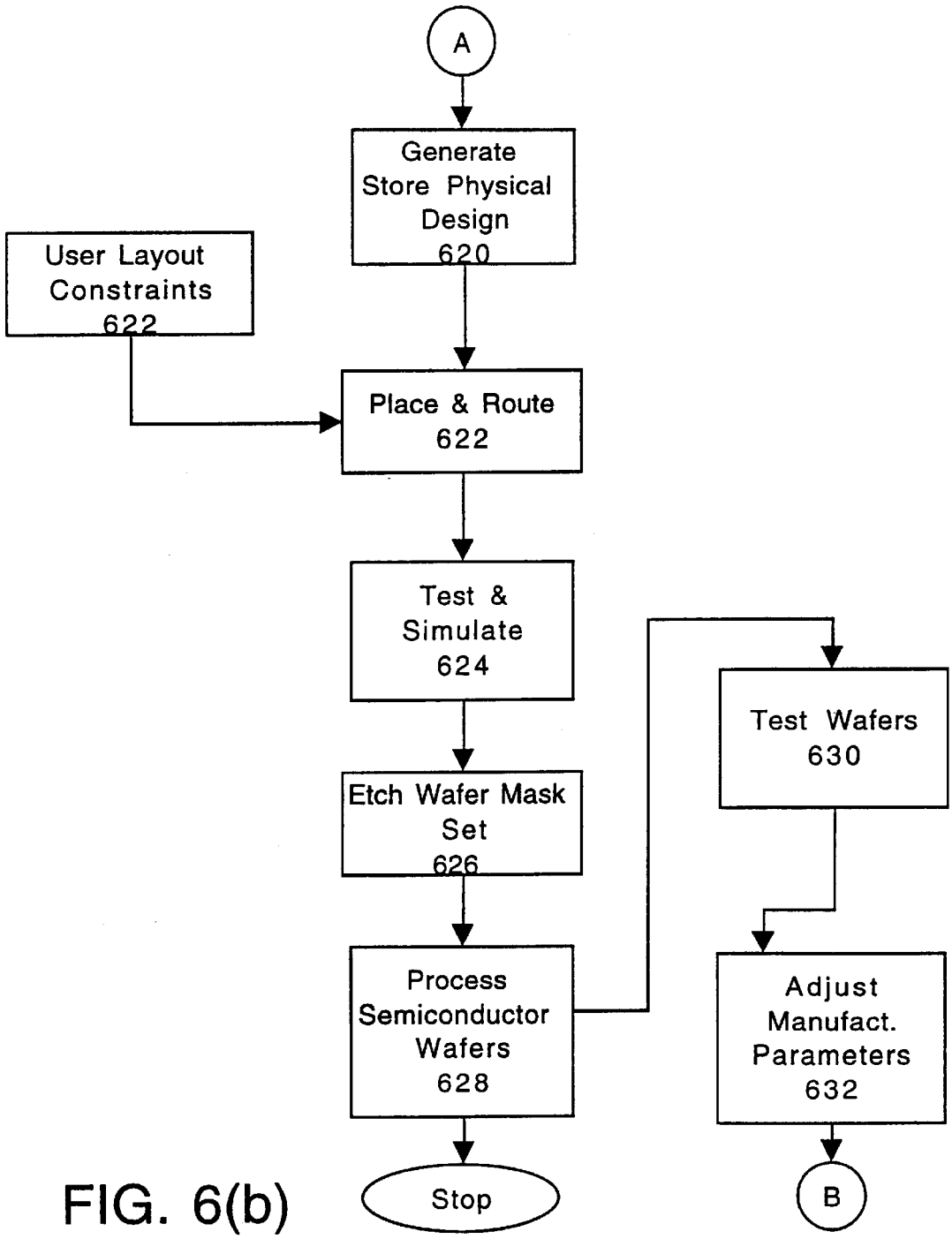

Referring now to FIGS. 6(a) and 6(b), a flow chart illustrates the preferred method of automated photolithography in the fabrication of integrated circuits. Beginning in step 604, processor 116 selects a light source 140 from an appropriate lithography module 138. In the IC design system 100, it is contemplated that more than one lithography module 138 may be available. Once the light source is selected 604, the processor 116 transfers information relating to the selected light source 140 to the Rayleigh processor 201 located in the Rayleigh derator 128. The Rayleigh processor 201 then accesses light source library 205 to identify the wavelength associated with the selected light source 140. Once the lithography module 138 is identified, the Rayleigh processor 201 also looks up the value of the numerical aperture used within module 138 in the aperture library 207.

Measurements relating to the manufacturing parameters of wafer process 125 are transferred to the m database 211 in step 602. The measurement of manufacturing parameters 602 may occur just prior to lithography of the wafer masks 137, or the measurements may take place as an ongoing process, with feedback updating measured wafer process 125 data as a function of wafer yield. The Rayleigh processor 201 then reads a Rayleigh constant, k, from the constant register 209 and combines this constant with the manufacturing constant m stored in m database 211. The Rayleigh processor 201 subsequently determines 608 minimum feature size R at wafer process 125. Determination 608 of the minimum feature size is processed according to the equation:

$$R = \frac{km\lambda}{NA}$$

where λ is equal to the wavelength of the light source 140, NA is equal to the numerical aperture, k is equal to the Rayleigh constant, and m is equal to the manufacturing process constant This minimum feature size R is then stored in feature size memory 130, and used by the form factor generator 132 to complete transistor sizing of the circuit design stored in the net list database 123.

Processor 116 reads 610 the net list stored in net list database 123 for the circuit design being processed. Processor 116 then transfers drain-source current values ($I_{DS}$) and gate-to-source voltages ($V_{GS}$) to the form factor processor 401. The form factor processor 401 also receives gate length information for each transistor device stored in the net list database 123, not having minimum feature size gate lengths as stored in feature size memory 130. If no gate length information is stored in the net list database 123 for a specific transistor device, then the processor 116 reads the minimum feature size R from the feature size memory 130 and transfers this value to the form factor processor 401 for generation of a device gate width. Along with the gate length, form factor processor 401 reads the threshold voltage ($V_T$) from the $V_T$ library 403, the gate oxide capacitance ($C_{gox}$) from the $C_{cox}$ library 405, and reads the mobility constant from the $\mu$ memory 407. The form factor processor 401 then generates 612 the appropriate device gate width according to the conventional sizing equation:

$$I_{DS} = \mu C_{gox} \frac{W}{L} \frac{(V_{GS} - V_T)^2}{2}$$

where $V_T$ is defined as the threshold voltage, $C_{gox}$ is the gate oxide capacitance, $\mu$ is the mobility constant, $I_{DS}$ is the drain-source current, $V_{GS}$ is the gate-to-source voltage, W is the gate width, and L is the gate length.

After the form factor processor 401 generates 612 the transistor's gate width, the processor 401 tests the net list database 123 in step 614 to determine whether additional devices are present in the net list database 123. If additional devices are present, the form factor processor 401 reads 610 the net list database 123 for additional transistor $I_{DS}$, $V_{GS}$, and L values to continue the generation 612 of additional gate widths. If no additional devices require processing, the method continues in Step 620 with the generation and storing of the physical design by the logic processor 501. The logic processor 501 reads net list data stored in net list database 123, and in conjunction with user defined parameters stored in user defined constraints library 505, produces a physical design for storage in physical design storage 507. This physical design preferably includes a circuit routing layout which specifies device geometry orientation and interconnect routing of the physical integrated circuit on a silicon substrate. Once the physical design is completed, in Step 622, testing and simulation of the physical design is performed by test and simulation module 509.

The tested physical design is then used to generate a wafer mask 137 set in Step 626. The wafer mask 137 set is generated by processor 116 transferring the physical design from physical design storage 507 to the lithography module 138. This physical design consists of a plurality of mask layers, where each mask layer represents a manufacturing step used in the wafer process 125. Each wafer mask 137 is conventionally etched 626 in the lithography module 138 by the light source 140. Processor 116 drives the lithography module 138 such that the light source 140 etches the wafer mask 137 patterns to correspond to the various layers of the physical design. The wafer masks 137 are then used by wafer process 125 to process semiconductor wafers 628 in a conventional manner. Subsequent to the processing of the semiconductor wafer 628 test measurements are made 630 of the wafers to enable the adjustment of manufacturing parameters 632 for use in improving the derating process of Step 606.

The invention has now been explained with reference to specific embodiments. Other embodiments will be apparent to those of ordinary skill in the art in light of this disclosure. Therefore it is not intended that this invention be limited, except as indicated by the appended claims.

What is claimed is:

[1. A method for automating the manufacture of an integrated circuit by means of a computer having a processor, a display, input means, output means, and a memory storing information, said method comprising the steps of:

measuring at least one process parameter for a wafer process;

storing said parameter in said memory;

electing a light source by said input means;

utilizing information stored in said memory to determine a wavelength and a numerical aperture associated with said selected light source;

determining a select minimum device feature size which can be manufactured in the wafer process based on said process parameter and said determined wavelength and numerical aperture;

reading a net list stored in said memory for said integrated circuit to determine, for a given device in said circuit, based on the select minimum device feature size, a minimum manufacturable feature size;

repeating the previous step for the other devices in said circuit;

sizing the individual devices of the integrated circuit in accordance with said minimum manufacturable feature sizes to produce sizing information; and obtaining said sizing information through said output means to complete the design of said integrated circuit.]

[2. The method according to claim 1 further comprising the step of manufacturing said integrated circuit having said devices in accordance with said minimum manufacturable feature sizes.]

[3. The method according to claim 2 wherein the select minimum device feature size relates to optical parameters of photolithography equipment used in the manufacture of the integrated circuit.]

[4. The method according to claim 3 wherein the select minimum device feature size is determined according to the formula:

$$R = \frac{k\lambda}{NA}$$

where R is said select minimum device feature size, $\lambda$ is a light source wavelength, NA is a numerical aperture value, and k is the value of a Rayleigh constant.]

[5. The method according to claim 1 wherein a manufacturing constant is generated from said measured process parameter.]

[6. The method according to claim 5 wherein said manufacturing constant is generated by applying weighting functions to the measured process parameter.]

[7. The method according to claim 5 wherein said manufacturing constant is a derating value which reflects variations in said process parameter.]

[8. The method according to claim 5 wherein the minimum manufacturable device feature size is determined by multiplying the select minimum device feature size by said manufacturing constant.]

[9. The method according to claim 1 wherein the measuring of the process parameter is performed automatically.]

[10. The method according to claim 1 wherein the measuring of the process parameter is performed continuously.]

[11. The method according to claim 3 wherein the optical parameters include aperture and wavelength associated with said photolithography equipment.]

[12. The method according to claim 3 wherein an enhanced Hg arc light is used in the photolithography equipment resulting in a minimum manufacturable feature size of no more than a quarter of a micron.]

[13. The method according to claim 3 wherein a KrF laser light is used in the photolithography equipment resulting in a minimum manufacturable feature size of no more than an eighth of a micron.]

[14. A method for automating the manufacture of a semiconductor device having a feature size below approximately 0.3 microns by means of a computer having processor, a display, input means, output means, and a memory storing information, said method comprising the steps of:

measuring at least one process parameter for a wafer process;

storing said parameter in said memory;

selecting a light source by said input means;

utilizing information stored in said memory to determine a wavelength and a numerical aperture associated with said selected light source;

determining a select minimum device feature size below approximately 0.3 microns which can be manufactured in the wafer process based on said process parameter and said determined wavelength and numerical aperture;

reading a net list stored in said memory for said integrated circuit to determine, for a given device in said circuit, based on the select minimum device feature size, a minimum manufacturable feature size below approximately 0.3 microns;

repeating the previous step for the other devices in said circuit;

sizing individual devices of the integrated circuit in accordance with said minimum manufacturable feature sizes to produce sizing information; and obtaining said sizing information through said output means to complete the design of said integrated circuit.]

[15. The method for automating the manufacture of an integrated circuit according to claim 14, further comprising the step of manufacturing said integrated circuit having said devices in accordance with said minimum manufacturable feature sizes.]

[16. The method according to claim 14 wherein the select minimum device feature size relates to optical parameters of photolithography equipment used in the manufacture of the integrated circuit.]

[17. The method according to claim 16 wherein the select minimum device feature size is determined according to the formula:

$$R = \frac{k\lambda}{NA}$$

where R is said select minimum device feature size, λ is a light source wavelength, NA is a numerical aperture value, and k is the value of a Rayleigh constant.]

[18. The method according to claim 14 wherein a manufacturing constant is generated from said measured process parameter.]

[19. The method according to claim 14 wherein said manufacturing constant is generated by applying weighting functions to the measured process parameters.]

*20. A method for automatically manufacturing an integrated circuit by means of a computer having a processor, a display, input means, output means, and a memory for storing information, said method comprising the steps of:*

*measuring at least one process parameter for a wafer process;*

*storing said parameter in said memory;*

*selecting a light source by said input means;*

*utilizing information stored in said memory to determine a wavelength and a numerical aperture associated with said selected light source;*

*determining a select minimum device feature size which can be manufactured in the wafer process based on said process parameter and said determined wavelength and numerical aperture;*

*manufacturing the integrated circuit in accordance with the determined device feature size;*

*evaluating the manufactured integrated circuit in light of the stored process parameter; and*

*storing a new process parameter in said memory based on the evaluation of the manufactured integrated circuit.*

*21. The method according to claim 20, wherein a manufacturing constant is generated from said measured process parameter.*

*22. The method according to claim 21, wherein said manufacturing constant is generated by applying weighting functions to the measured process parameter.*

*23. The method according to claim 21, wherein said manufacturing constant is a derating value which reflects variations in said process parameter.*

*24. The method according to claim 21, wherein the minimum device feature size is determined by multiplying the select minimum device feature size by said manufacturing constant.*

*25. The method according to claim 20, wherein the measuring of the process parameter is performed continuously.*

*26. The method according to claim 20, wherein the measuring of the process parameter is performed automatically.*

*27. The method according to claim 20, wherein evaluating the manufactured integrated circuit is performed by taking wafer-test measurements on finished integrated circuits.*

*28. The method according to claim 20, wherein evaluating the manufactured circuit is performed by taking wafer-test measurements on in-line wafers during manufacturing.*

*29. The method according to claim 20, wherein the step of evaluating the manufactured integrated circuit includes determining the wafer yield.*

*30. The method according to claim 29, wherein the step of evaluating the manufactured circuit comprises balancing the benefits of small device geometries against the benefits of higher wafer yields.*

*31. The method according to claim 20, wherein the steps of measuring at least one process parameter through storing a new device parameter comprise an automated process feedback loop.*

*32. The method according to claim 20, wherein the steps of measuring at least one process parameter through storing a new device parameter comprise a continuous process feedback loop.*

*33. A system for automatically manufacturing an integrated circuit comprising:*

*computer means including a processor, a display, input means, output means, and a memory storing information;*

*means for measuring at least one process parameter for a wafer process;*

*means for storing said parameter in said memory;*

*means for selecting a light source by said input means;*

*means for utilizing information stored in said memory to determine a wavelength and a numerical aperture associated with said selected light source;*

*means for determining a select minimum device feature size which can be manufactured in the wafer process based on said process parameter and said determined wavelength and numerical aperture;*

*means for manufacturing the integrated circuit in accordance with the determined device feature size;*

*means for evaluating the manufactured integrated circuit in light of the stored process parameter; and*

*means for storing a new process parameter in said input memory based on the evaluation of the manufactured integrated circuit.*

*34. The system according to claim 33, wherein the means for measuring the process parameter enables continuous measurement.*

*35. The system according to claim 33, wherein the means for measuring the process parameter enables automatic measurement.*

*36. A method for manufacturing an integrated circuit, comprising the steps of:*

*designing the integrated circuit using a first processor based system, including a first memory, coupled to the first processor, storing*

*a light source library of information related to a given light source, and an aperture library containing information for numerical apertures; and*

*having a k constant register for storing a derating constant;*

*a second memory, coupled to the first processor, for storing a minimum device feature size;*

*a third memory, coupled to the first processor, storing a netlist database of circuit components; and*

*a fourth memory, coupled to the first processor, storing:*

*a $V_T$ library of threshold voltages for various MOS transistors, and*

*a $C_{GOX}$ library of gate oxide capacitances of various MOS transistors; and*

*having a $\mu$ memory storing a mobility constant $\mu$;*

*calculating the minimum device feature size using the stored contents of the first memory;*

*storing the minimum device feature size in the second memory;*

*using the fourth memory to calculate a size for each circuit component in the third memory based on the minimum device feature size stored in the second memory; and*

*producing the integrated circuit in a production system controlled by a second processor system according to the calculated circuit component sizes.*

*37. A method of manufacturing integrated circuits, comprising the steps of:*

*(a) determining a minimum manufacturable feature size using a feature size subroutine that utilizes*

*(i) a first memory including*

*a light source library of information related to a given light source, and an aperture library of information for numerical apertures; and*

*having a k constant register for storing a derating constant; and*

*(ii) a second memory for storing the minimum manufacturable device feature size;*

*(b) sizing circuit elements using a form factor subroutine that utilizes*

*(i) a third memory storing a netlist database of circuit components; and*

*(ii) a fourth memory including*

*a $V_T$ library for storing threshold voltages for various MOS transistors, and*

*a $C_{GOX}$ library for storing gate oxide capacitances of various MOS transistors; and*

*having a $\mu$ memory for storing a mobility constant $\mu$;*

*(c) generating a set of wafer masks based on the sized circuit elements; and*

*(d) producing the integrated circuits based on the set of wafer masks.*

*38. The method of claim 37, wherein the first memory further has a constant register (m) for receiving and storing data relating to variations in the manufacturing of the integrated circuits.*

*39. The method of claim 38, further comprising the step of measuring the produced integrated circuits for variations due to manufacturing.*

*40. The method of claim 39, further comprising the step of updating the constant register (m) with the data relating to variations in the manufacturing of the integrated circuits.*

*41. A method for automating the manufacture of an integrated circuit by means of a computer having a processor, a display, input means, output means, and a memory storing information, said method comprising the steps of:*

*measuring at least one process parameter for a wafer process;*

*storing said parameter in said memory;*

*selecting a light source by said input means;*

*utilizing information stored in said memory to determine a wavelength and a numerical aperture associated with said selected light source;*

*determining a select minimum device feature size which can be manufactured in the wafer process based on said process parameter and said determined wavelength and numerical aperture;*

*reading a net list stored in said memory for said integrated circuit to determine, for a given device in said circuit, based on the select minimum device feature size, a minimum manufacturable feature size;*

*repeating the previous step for the other devices in said circuit;*

*sizing the individual devices of the integrated circuit in accordance with said minimum manufacturable feature sizes to produce sizing information; and*

*obtaining said sizing information through said output means to complete the design of said integrated circuit.*

*42. The method according to claim 41 further comprising the step of manufacturing said integrated circuit having said devices in accordance with said minimum manufacturable feature sizes.*

*43. The method according to claim 42 wherein the select minimum device feature size relates to optical parameters of*

*photolithography equipment used in the manufacture of the integrated circuit.*

*44. The method according to claim 43 wherein the select minimum device feature size is determined according to the formula:*

$$R = \frac{k\lambda}{NA}$$

*where R is said select minimum device feature size, λ is a light source wavelength, NA is a numerical aperture value, and k is the value of a Rayleigh constant.*

*45. The method according to claim 41 wherein a manufacturing constant is generated from said at least one measured process parameter.*

*46. The method according to claim 45 wherein said manufacturing constant is generated by applying weighting functions to the at least one measured process parameter.*

*47. The method according to claim 45 wherein said manufacturing constant is a derating value which reflects variations in said process parameter.*

*48. The method according to claim 45 wherein the minimum manufacturable device feature size is determined by multiplying the select minimum device feature size by said manufacturing constant.*

*49. The method according to claim 41 wherein the measuring of the at least one process parameter is performed automatically.*

*50. The method according to claim 41 wherein the measuring of the at least one process parameter is performed continuously.*

*51. The method according to claim 43 wherein the optical parameters include aperture and wavelength associated with said photolithography equipment.*

*52. The method according to claim 43 wherein an enhanced Hg arc light is used in the photolithography equipment resulting in a minimum manufacturable feature size of no more than a quarter of a micron.*

*53. The method according to claim 43 wherein a KrF laser light is used in the photolithography equipment resulting in a minimum manufacturable feature size of no more than an eighth of a micron.*

*54. A method for automating the manufacture of a semiconductor device having a feature size below approximately 0.3 microns by means of a computer having a processor, a display, input means, output means, and a memory storing information, said method comprising the steps of:*

*measuring at least one process parameter for a wafer process;*

*storing said parameter in said memory;*

*selecting a light source by said input means;*

*utilizing information stored in said memory to determine a wavelength and a numerical aperture associated with said selected light source;*

*determining a select minimum device feature size below approximately 0.3 microns which can be manufactured in the wafer process based on said process parameter and said determined wavelength and numerical aperture;*

*reading a net list stored in said memory for said integrated circuit to determine, for a given device in said circuit, based on the select minimum device feature size, a minimum manufacturable feature size below approximately 0.3 microns;*

*repeating the previous step for the other devices in said circuit;*

*sizing individual devices of the integrated circuit in accordance with said minimum manufacturable feature sizes to produce sizing information; and*

*obtaining said sizing information through said output means to complete the design of said integrated circuit.*

*55. The method for automating the manufacture of an integrated circuit according to claim 53, further comprising the step of manufacturing said integrated circuit having said devices in accordance with said minimum manufacturable feature sizes.*

*56. The method according to claim 54 wherein the select minimum device feature size relates to optical parameters of photolithography equipment used in the manufacture of the integrated circuit.*

*57. The method according to claim 56 wherein the select minimum device feature size is determined according to the formula:*

$$R = \frac{k\lambda}{NA}$$

*where R is said select minimum device feature size, λ is a light source wavelength, NA is a numerical aperture value, and k is the value of a Rayleigh constant.*

*58. The method according to claim 54 wherein a manufacturing constant is generated from said measured process parameter.*

*59. The method according to claim 54 wherein said manufacturing constant is generated by applying weighting functions to the measured process parameters.*

*60. A system for automating the manufacture of an integrated circuit by means of a computer having a processor, a display, input means, output means, and a memory storing information, said system comprising:*

*means for measuring at least one process parameter for a wafer process;*

*means for storing said parameter in said memory;*

*means for selecting a light source by said input means;*

*means for utilizing information stored in said memory to determine a wavelength and a numerical aperture associated with said selected light source;*

*means for determining a select minimum device feature size which can be manufactured in the wafer process based on said process parameter and said determined wavelength and numerical aperture;*

*means for reading a net list stored in said memory for said integrated circuit to determine, for a given device in said circuit, based on the select minimum device feature size, a minimum manufacturable feature size;*

*means for repeatedly applying the means for reading to the other devices in said circuit;*

*means for sizing the individual devices of the integrated circuit in accordance with said minimum manufacturable feature sizes to produce sizing information; and*

*means for obtaining said sizing information through said output means to complete the design of said integrated circuit.*

*61. A system for automating the manufacture of a semiconductor device having a feature size below approximately 0.3 microns by means of a computer having a processor, a display, input means, output means, and a memory storing information, said system comprising:*

*means for measuring at least one process parameter for a wafer process;*

*means for storing said parameter in said memory;*

*means for selecting a light source by said input means;*

*means for utilizing information stored in said memory to determine a wavelength and a numerical aperture associated with said selected light source;*

*means for determining a select minimum device feature size below approximately 0.3 microns which can be manufactured in the wafer process based on said process parameter and said determined wavelength and numerical aperture;*

*means for reading a net list stored in said memory for said integrated circuit to determine, for a given device in said circuit, based on the select minimum device feature size, a minimum manufacturable feature size below approximately 0.3 microns;*

*means for repeatedly applying the means for reading to the other devices in said circuit;*

*means for sizing the individual devices of the integrated circuit in accordance with said minimum manufacturable feature sizes to produce sizing information; and*

*means for obtaining said sizing information through said output means to complete the design of said integrated circuit.*

* * * * *